US005779969A

United States Patent [19]
Chatterjee et al.

[11] Patent Number: 5,779,969
[45] Date of Patent: Jul. 14, 1998

[54] METHOD FOR FABRICATING MULTIWOUND MICROCOILS EMBEDDED IN A CERAMIC SUBSTRATE

[75] Inventors: Dilip K. Chatterjee, Rochester; Edward P. Furlani, Lancaster; Syamal K. Ghosh, Rochester, all of N.Y.

[73] Assignee: Eastman Kodak Company, Rochester, N.Y.

[21] Appl. No.: 879,546

[22] Filed: Jun. 20, 1997

[51] Int. Cl.⁶ .................................................. C04B 33/34
[52] U.S. Cl. .......................... 264/619; 264/614; 264/635; 264/643
[58] Field of Search .................... 264/614, 618, 264/619, 635, 643

[56] References Cited

U.S. PATENT DOCUMENTS

| | | | |
|---|---|---|---|
| 4,994,215 | 2/1991 | Wiech, Jr. | 264/27 |
| 5,240,671 | 8/1993 | Carey | 419/9 |
| 5,683,649 | 11/1997 | Chatterjee et al. | 264/619 |

Primary Examiner—Christopher A. Fiorilla
Attorney, Agent, or Firm—Raymond L. Owens

[57] ABSTRACT

A method for fabricating a multiwound microcoil embedded in a ceramic substrate including the steps of forming a sacrificial multiwound microcoil, having a melting temperature greater than the sintering temperature of the ceramic material to be used as the ceramic substrate by wrapping a first sacrificial coil winding in a helical fashion on the midsection of a sintered ceramic bar thereby forming a one winding sacrificial coil structure; wrapping a first layer of tape cast ceramic material around the midsection of said one winding sacrificial coil structure thereby forming a first coated one winding sacrificial coil structure; wrapping a second sacrificial coil winding in a helical fashion on the midsection of said first coated one winding sacrificial coil structure thereby forming a two winding sacrificial coil structure. The method further includes forming green ceramic material into the shape of the ceramic substrate incorporating said formed sacrificial multiwound microcoil; sintering the green ceramic material; removing the sacrificial multiwound microcoil from the sintered ceramic substrate; flowing molten electrically conductive material into the space relinquished by the removed sacrificial multiwound microcoil; and cooling the molten electrically conductive material to fabricate the multiwound microcoil embedded in a ceramic substrate.

4 Claims, 7 Drawing Sheets

METHOD FOR FABRICATING MULTIWOUND MICROCOILS EMBEDDED IN A CERAMIC SUBSTRATE

CROSS REFERENCE TO RELATED APPLICATION

Reference is made to commonly assigned U.S. patent application Ser. No. 08/751,529 filed Nov. 14, 1996, entitled "A Method for the Fabrication of Micro-Electromechanical Ceramic Parts With an Electrical Trace" by Chatterjee et al, now U.S. Pat. No. 5,683,649 the teachings of which are incorporated herein.

FIELD OF THE INVENTION

This invention relates generally to the field of micro-electromechanical devices, and in particular to a method for fabricating multiwound microcoils embedded in a ceramic substrate using refractory sacrificial fibers.

BACKGROUND OF THE INVENTION

Conventional electromechanical devices are greater than 1 cubic centimeter in volume. The materials and methods for the fabrication of these devices are inadequate for the fabrication of micro-electromechanical devices which are less than 1 cubic centimeter in volume. However, such microdevices can be fabricated using micromolded ceramic technology. One drawback to this approach is that electromechanical devices such as motors and actuators typically utilize energized coils to implement the motion of a permanent magnet or vice versa. For microdevices, these coils need to be on the order of 100 microns in diameter or less, and they need to be attached to, or embedded in, the micromolded sintered ceramic piece. However, highly conductive materials such as copper or gold have a melting point below the sintering temperature, and therefore cannot be embedded before sintering.

The method of the present invention provides a solution to this problem.

SUMMARY OF THE INVENTION

It is an object of the present invention to fabricate a multiwound microcoil embedded in a ceramic substrate. This object is achieved in a method for fabricating a multiwound microcoil embedded in a ceramic substrate comprising the steps of:

a) forming a sacrificial multiwound microcoil, having a melting temperature greater than the sintering temperature of the ceramic material to be used as the ceramic substrate by;

(i) wrapping a first sacrificial coil winding in a helical fashion on the midsection of a sintered ceramic bar thereby forming a one winding sacrificial coil structure;

(ii) wrapping a first layer of tape cast ceramic material around the midsection of the one winding sacrificial coil structure thereby forming a first coated one winding sacrificial coil structure;

(iii) wrapping a second sacrificial coil winding in a helical fashion on the midsection of the first coated one winding sacrificial coil structure thereby forming a two winding sacrificial coil structure;

(iv) repeating steps (a) (ii) and (a)(iii) until the desired number of sacrificial coil windings are formed;

b) forming green ceramic material into the shape of the ceramic substrate incorporating the formed sacrificial multiwound microcoil;

c) sintering the green ceramic material;

d) removing the sacrificial multiwound microcoil from the sintered ceramic substrate;

e) flowing molten electrically conductive material into the space relinquished by the removed sacrificial multiwound microcoil; and f) cooling the molten electrically conductive material to fabricate the multiwound microcoil embedded in a ceramic substrate.

These and other aspects, objects, features, and advantages of the present invention will be more clearly understood and appreciated from a review of the following detailed description of the preferred embodiment and appended claims, and by reference to the accompanying drawings.

The present invention has the following advantages:

micro-electromechanical devices with embedded multiwound coils can be fabricated in ceramic substrates;

with micromolding, large numbers of the devices may be fabricated at one time; and because the devices are fabricated in a ceramic substrate they are able to withstand harsh high temperature and corrosive operating environments.

BRIEF DESCRIPTION OF THE DRAWINGS

To facilitate understanding, identical reference numerals have been used, where possible, to designate identical elements that are common to the figures.

DETAILED DESCRIPTION OF THE PREFERRED EMBODIMENTS

The method of the present invention will be described in conjunction with the fabrication of a specific component. This is by way of example only in that the teachings of the present method may be used to fabricate a wide range of micro-electromechanical components or devices.

Figure 1:
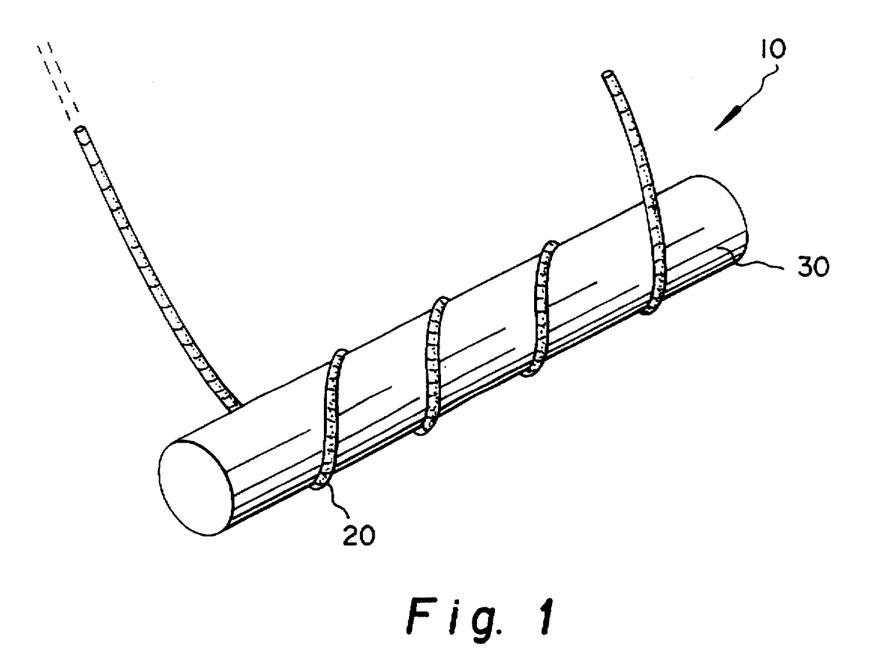
FIG. 1 is a perspective of a one winding sacrificial coil structure comprising a ceramic bar with a first sacrificial coil winding wrapped around its midsection.

Referring to FIG. 1, a perspective is shown of a one winding sacrificial coil structure 10 comprising a first sacrificial coil winding 20 wrapped in a helical fashion on the midsection of sintered cylindrical ceramic bar 30. The first sacrificial coil winding 20 is made from refractory materials such as W, Mo, or Ta and is on the order of 100 microns in diameter or less.

Figure 2:
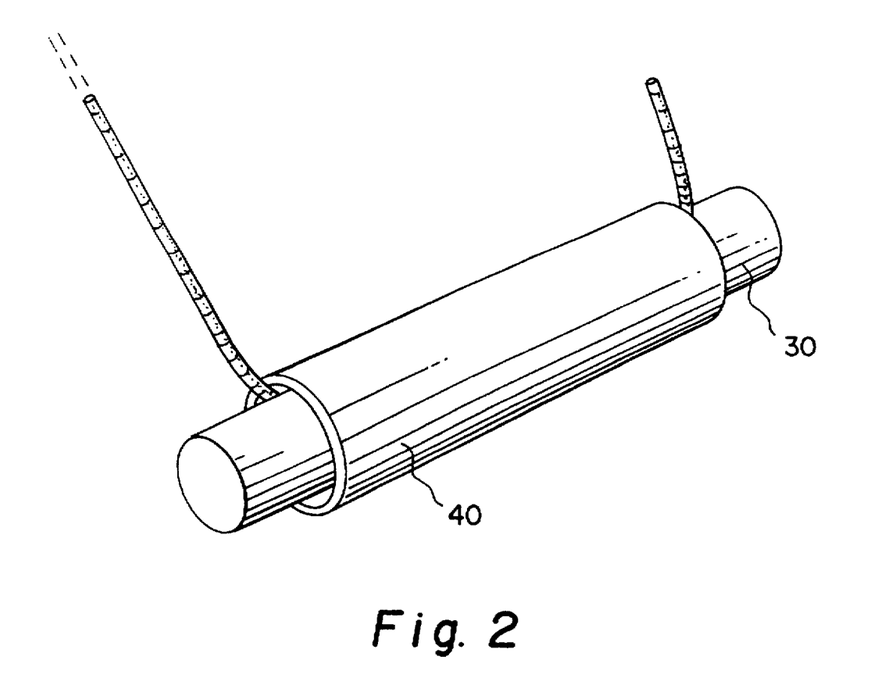
FIG. 2 shows a first layer of tape cast ceramic material wrapped around the midsection of the one winding sacrificial coil structure shown in FIG. 1.

Referring to FIG. 2, a first layer of tape cast ceramic material 40 is shown wrapped around the midsection of the one winding sacrificial coil structure 10 shown in FIG. 1.

Figure 3:
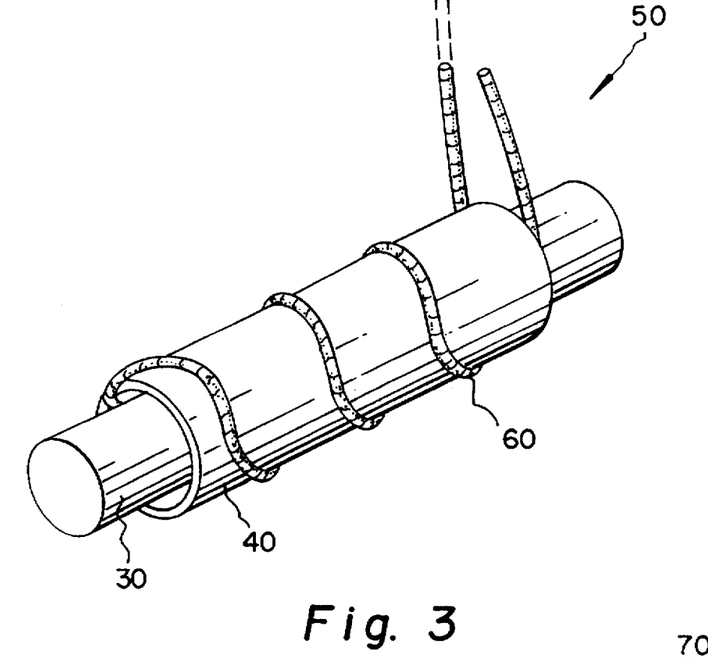
FIG. 3 is a perspective of a two winding sacrificial coil structure comprising a second sacrificial coil wrapped in a helical fashion on the midsection of the first layer of tape cast ceramic material of FIG. 2.

Referring to FIG. 3, a perspective is shown of a two winding sacrificial coil structure 50 comprising a second sacrificial coil winding 60 wrapped in a helical fashion on the midsection of a first layer of tape cast ceramic material 40. The second sacrificial coil winding 60 is made from refractory materials such as W, Mo, or Ta and is on the order of 100 microns in diameter or less.

Figure 4:
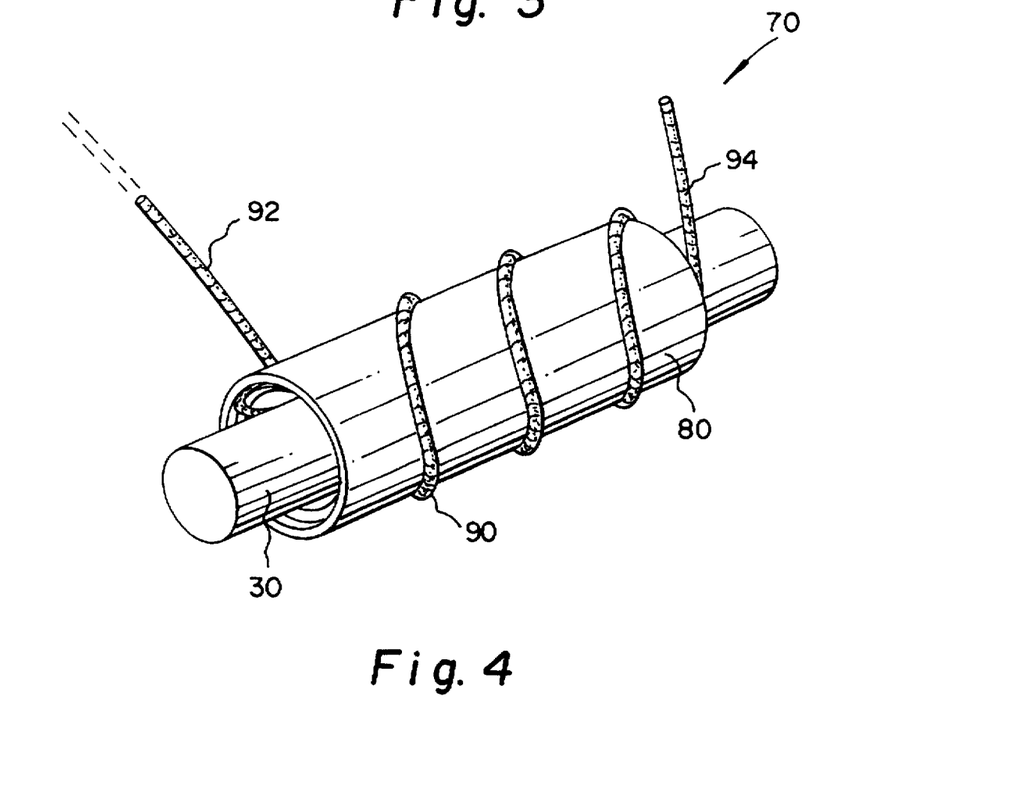
FIG. 4 is a perspective of the a three winding sacrificial coil structure of the present in which a second layer of tape cast ceramic material has been wrapped on the midsection of the two winding sacrificial coil structure of FIG. 2, and a third sacrificial coil winding is wrapped in a helical fashion on the midsection of the second layer of tape cast ceramic material.

Referring to FIG. 4, a perspective is shown of a three winding sacrificial coil structure 70 in which a second layer of tape cast ceramic material 80 has been wrapped on the midsection of the two winding sacrificial coil structure 50 with a third sacrificial coil winding 90 wrapped in a helical fashion on the midsection of the second layer of tape cast ceramic material 80. The third sacrificial coil winding 90 is made from refractory materials such as W, Mo, or Ta and is on the order of 100 microns in diameter or less. The three winding sacrificial coil structure 70 has terminal ends 92 and 94.

Figure 5A:
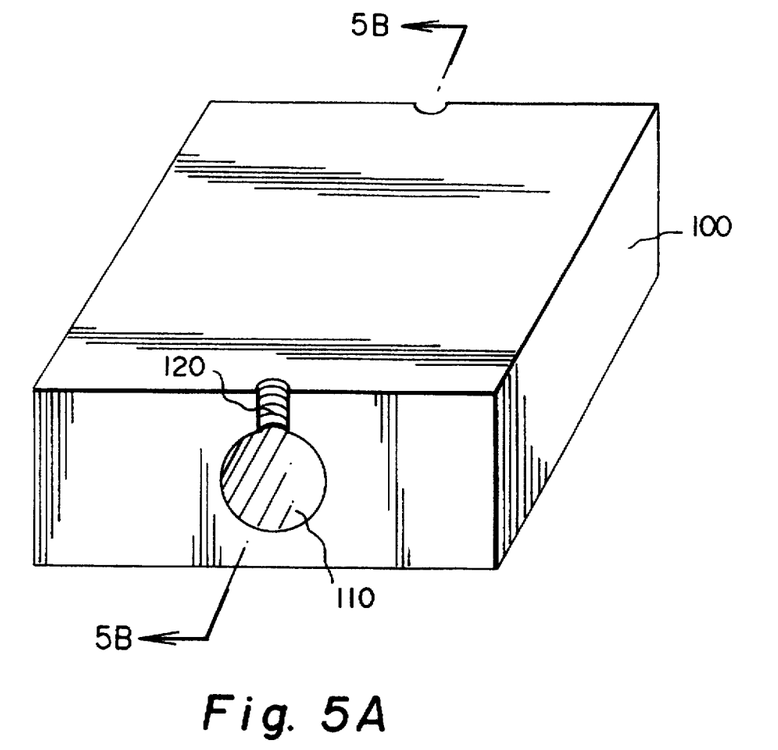
FIGS. 5A and 5B illustrates, in perspective, a micromolded ceramic substrate of the present invention and a cross section of the micromolded ceramic substrate taken along the section line B—B, respectively.
Figure 5B:
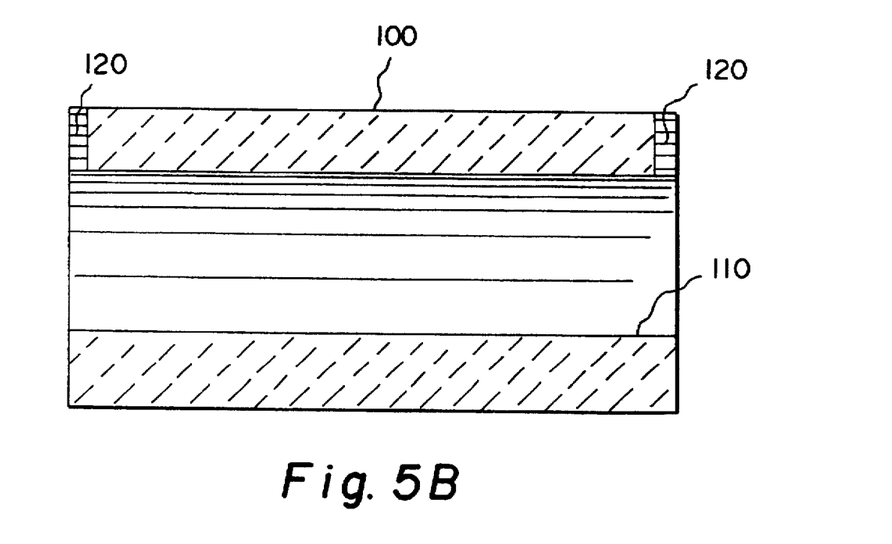

FIGS. 5A and 5B illustrate in perspective and cross-sectional view respectively, a rectangular micromolded ceramic substrate 100, to be selected from highly insulating ceramics such as $Al_2O_3$, $Zro_2$, Aln, BN, MgO, $Al_2O_3$-$BrO_2$ components, etc., in a green state, formed with a cylindrical cavity 110 and grooved paths 120 leading from the ends of the cavity 110 to the surface of the substrate. The fabrication of the micromolded ceramic substrate 100 preferably takes place in a mold which duplicates its outer shape and internal features. The use of the term "green" means that when particulate ceramic powder, preferably mixed with an organic binder is subjected to uniform compacting forces in order to provide an unsintered perform which has uniform density.

Figure 6A:
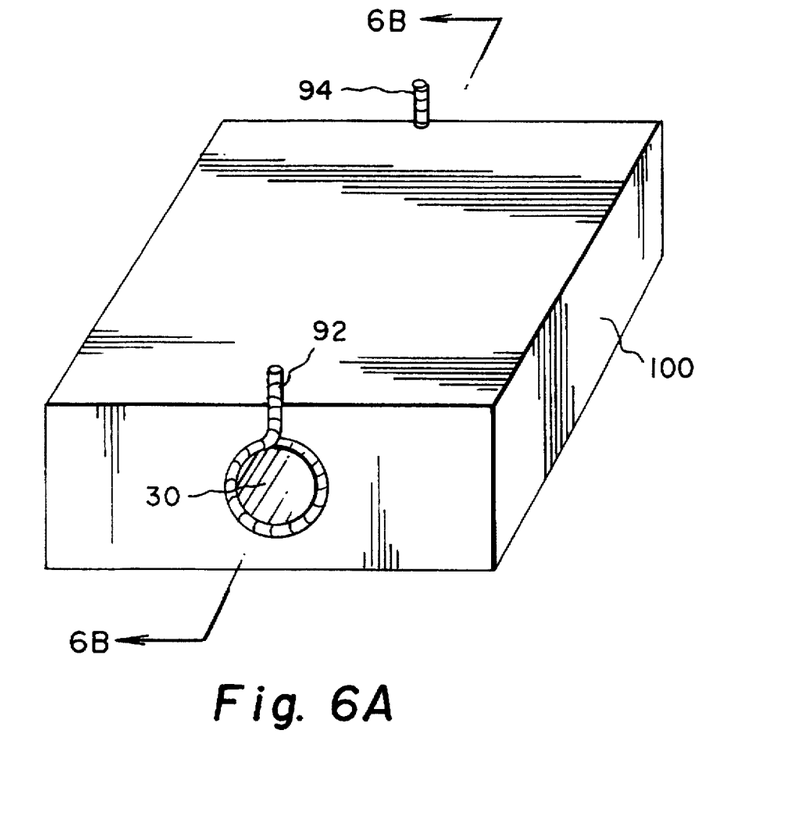
FIGS. 6A and 6B illustrate a perspective of an assembled ceramic structure in which the sacrificial coil structure of FIG. 4 has been inserted into the micromolded piece of FIG. 5A, and a cross section of the assembled ceramic structure taken along the section line B—B, respectively.
Figure 6B:
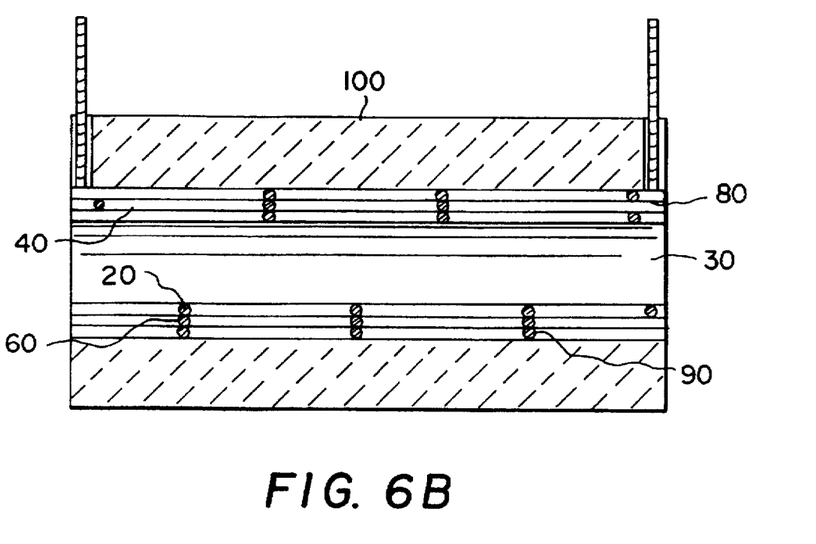

Referring next to FIGS. 6A and 6B, in the next step of the process, the three winding sacrificial coil structure 70 is inserted into the cylindrical cavity 110 of micromolded ceramic substrate 100. The terminal ends 92 and 94 of the three winding sacrificial coil structure 70 are placed in grooved paths 120. It is instructive to note that the diameter of the cylindrical cavity 110 is large enough to accommodate the inserted three winding sacrificial coil structure 70 with additional space to allow for 20 to 30% shrinkage of the cavity 110 upon sintering so as to preclude fracturing of the micromolded ceramic substrate 100 during the sintering process.

Figure 7A:
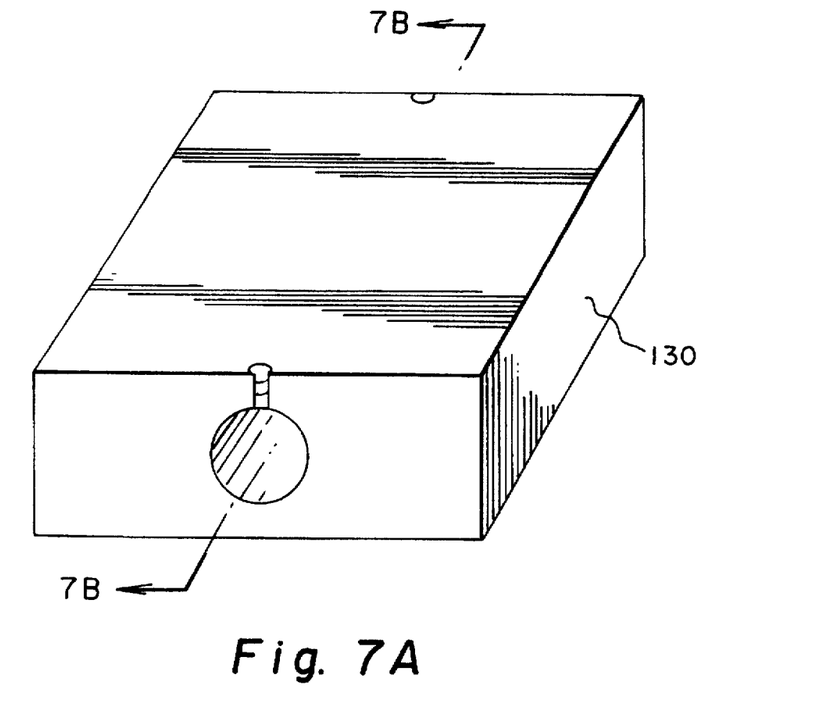
FIGS. 7A and 7B illustrate a perspective of a unitary ceramic structure formed by sintering the assembled ceramic structure of FIG. 6a, followed by etching away the sacrificial coil windings to form an embedded coil receiving cavity, and a cross section taken along the section line B—B, respectively.
Figure 7B:
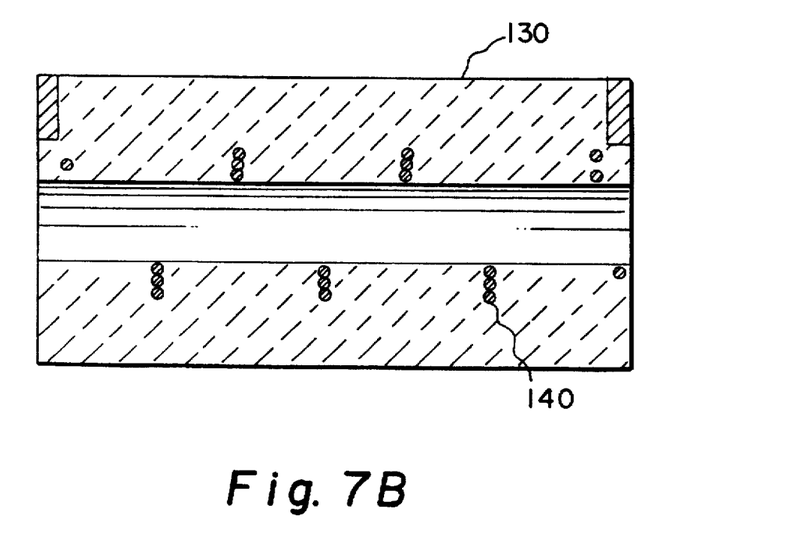

Referring now to FIGS. 7A and 7B, in the next step of the process, the assembly of FIGS. 6A and 6B is sintered forming a unitary ceramic structure 130 and the first, second and third sacrificial coil windings 20, 60 and 90 respectively, are etched away leaving an embedded coil receiving cavity 140 through the a unitary ceramic structure 130. The sacrificial coil windings 20, 60 and 90 are etched away using ammonium hydroxide $NH_4OH$ or hydrochloric acid HCl.

Figure 8:
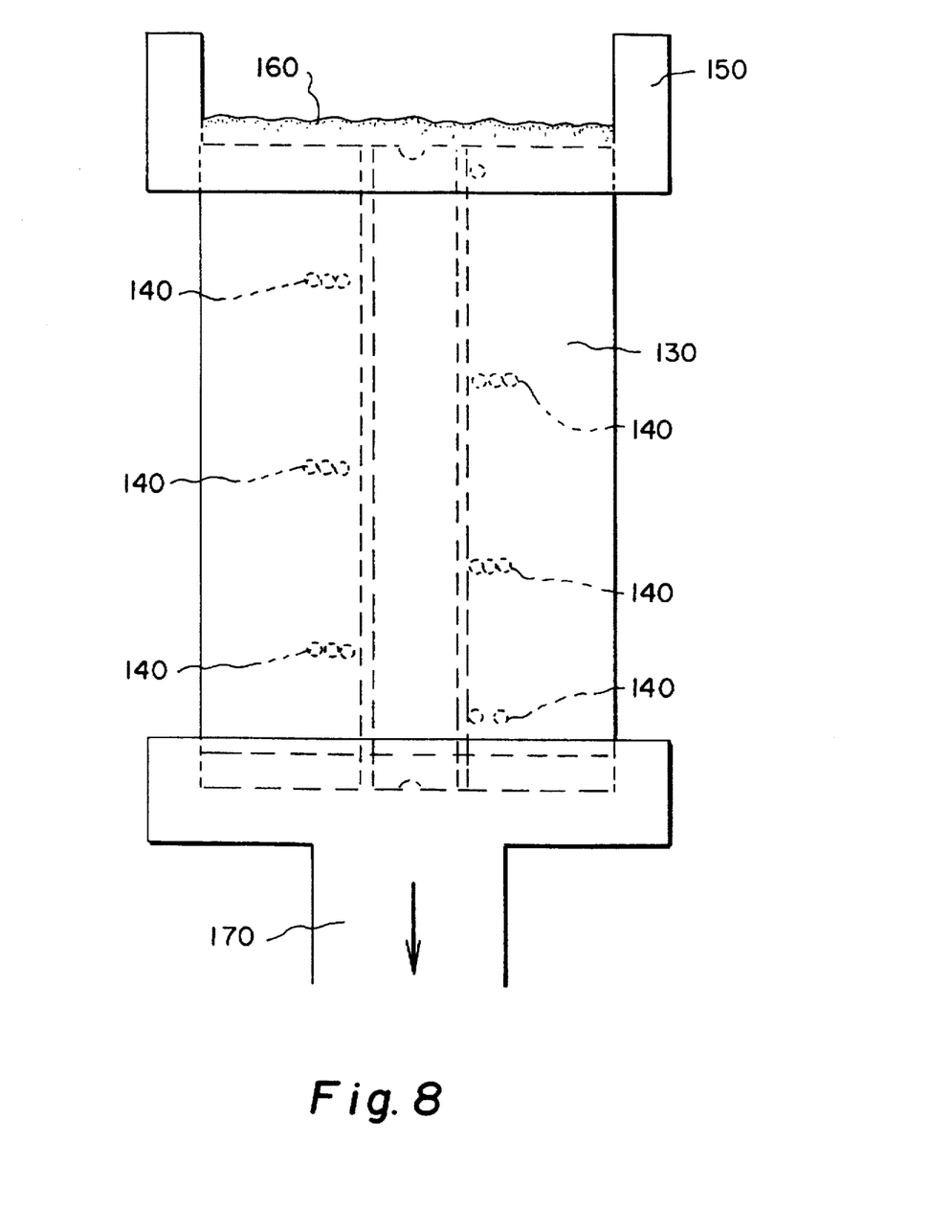
FIG. 8 illustrates the process of drawing a molten electrically conductive material into the embedded coil receiving cavity.

Referring now to FIG. 8, the unitary ceramic structure 130 with the embedded coil receiving cavity 140 is mounted in a vertical fashion with its top portion surrounded on all sides by a nonporous container 150 (dam) and a molten pool of electrically conductive metal alloy 160 such as Au, Ag, Ag-Cu, or Cu-Sn, or alternatively, a thin layer of conductive paste which is applied over the top of the unitary ceramic structure 130. The bottom of the unitary ceramic structure 130 is connected to a vacuum chamber 170 which is continually pumped so as to draw the molten metal alloy 160 or conductive paste through the embedded coil receiving cavity 140. In this way, the molten electrically conductive metal alloy 160 is made to fill the embedded coil receiving cavity 140 thereby forming an multiwound microcoil 180 (see FIGS. 9A and 9B) embedded in the unitary ceramic structure 130.

Figure 9A:
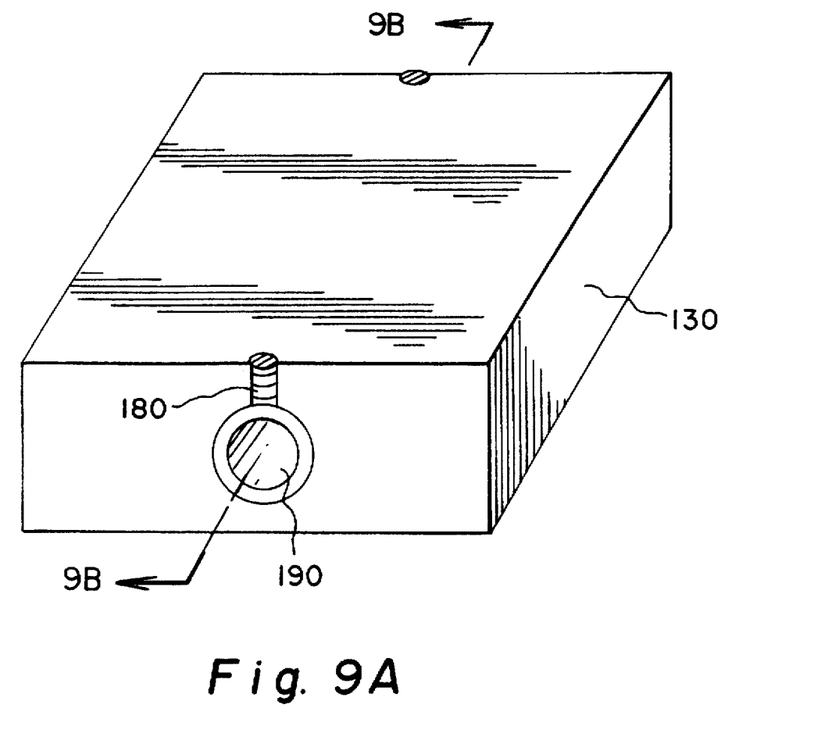
FIGS. 9A and 9B illustrate a perspective view of the ceramic substrate of the present invention with the molten electrically conductive material hardened and in place, and a cross section taken along the section line B—B, respectively.
Figure 9B:
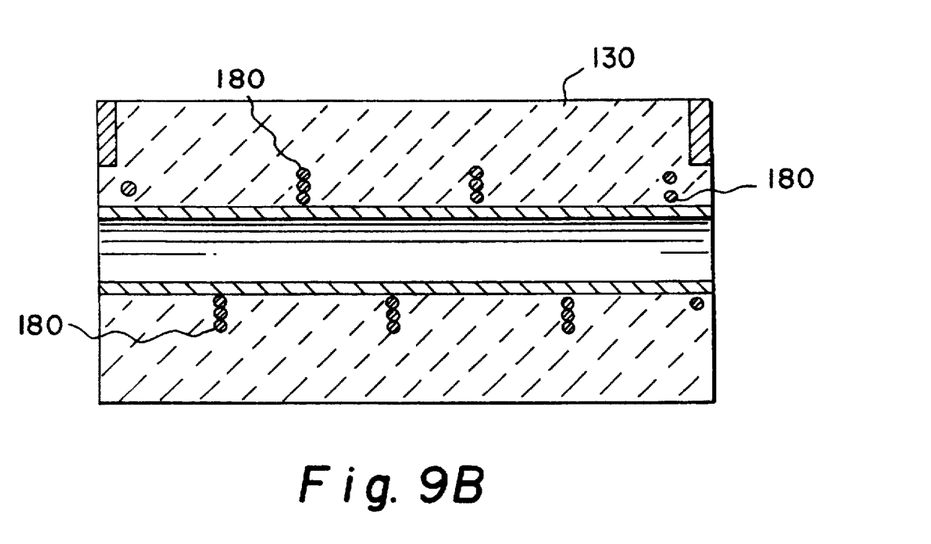

Referring now to FIGS. 9A and 9B, the unitary ceramic structure 130 with the embedded multiwound microcoil 180 is subjected to a drilling operation to remove the sintered ceramic bar 30 so as to form a cylindrical cavity 190 that is concentric to the embedded multiwound microcoil 180. Alternatively, the sintered ceramic bar 30 can be chemically etched away preferentially with respect to the unitary ceramic structure 130. For example, the unitary ceramic structure 130 can be made using alumina or zirconia ceramic and the sintered ceramic bar 30 can be made using AlN or BN. This constitutes the finished part.

The invention has been described in detail with particular reference to certain preferred embodiments thereof, but it will be understood that variations and modifications can be effected within the spirit and scope of the invention.

What is claimed is:

1. A method for fabricating a multiwound microcoil embedded in a ceramic substrate comprising the steps of:

a) forming a sacrificial multiwound microcoil, having a melting temperature greater than the sintering temperature of the ceramic material to be used as the ceramic substrate by;

(i) wrapping a first sacrificial coil winding in a helical fashion on the midsection of a sintered ceramic bar thereby forming a one winding sacrificial coil structure;

(ii) wrapping a first layer of tape cast ceramic material around the midsection of said one winding sacrificial coil structure thereby forming a first coated one winding sacrificial coil structure;

(iii) wrapping a second sacrificial coil winding in a helical fashion on the midsection of said first coated one winding sacrificial coil structure thereby forming a two winding sacrificial coil structure;

(iv) repeating steps (a) (ii) and (a)(iii) until the desired number of sacrificial coil windings are formed, thus producing a sacrificial multiwound microcoil having tape cast ceramic material layers therein;

b) forming green ceramic material into the shape of the ceramic substrate incorporating said formed sacrificial multiwound microcoil;

c) sintering the green ceramic material and the tape cast ceramic material to form a unitary sintered ceramic substrate;

d) removing the sacrificial multiwound microcoil from the sintered ceramic substrate;

e) flowing molten electrically conductive material into the space relinquished by the removed sacrificial multiwound microcoil; and cooling the molten electrically conductive material to fabricate the multiwound microcoil embedded in a ceramic substrate.

2. The method for fabricating a multiwound microcoil embedded in a ceramic substrate according to claim 1 wherein the sacrificial multiwound coil is removed by etching.

3. The method for fabricating a multiwound microcoil embedded in a ceramic substrate according to claim 1 wherein the sacrificial multiwound microcoil is removed by increasing the temperature of the sintered ceramic part above the melting point of the sacrificial multiwound microcoil.

4. The method for fabricating a multiwound microcoil embedded in a ceramic substrate according to claim 1, wherein the sacrificial multiwound microcoil is tungsten, molybdenum, or tantalum.

* * * * *